(12) United States Patent
Hu et al.

(10) Patent No.: US 9,019,776 B2
(45) Date of Patent: Apr. 28, 2015

(54) MEMORY ACCESS CIRCUIT FOR DOUBLE DATA/SINGLE DATA RATE APPLICATIONS

(75) Inventors: Chih-Huei Hu, Miaoli County (TW); Chia-Wei Chang, Tainan (TW); Der-Min Yuan, New Taipei (TW)

(73) Assignee: Etron Technology, Inc., Hsinchu (TW)

( * ) Notice: Subject to any disclaimer, the term of this patent is extended or adjusted under 35 U.S.C. 154(b) by 97 days.

(21) Appl. No.: 13/535,381

(22) Filed: Jun. 28, 2012

(65) Prior Publication Data

US 2013/0064018 A1 Mar. 14, 2013

(30) Foreign Application Priority Data

Sep. 13, 2011 (TW) .............................. 100132847 A

(51) Int. Cl.
*G11C 7/00* (2006.01)
*G11C 7/10* (2006.01)

(52) U.S. Cl.
CPC ............ *G11C 7/1045* (2013.01); *G11C 7/1051* (2013.01); *G11C 7/1078* (2013.01)

(58) Field of Classification Search
CPC ... G11C 7/1045; G11C 7/1078; G11C 7/1051
USPC ............ 365/189.02, 230.03, 233, 189.05, 63, 365/200, 296, 221, 230.09
See application file for complete search history.

(56) References Cited

U.S. PATENT DOCUMENTS

| 6,335,889 B1* | 1/2002 | Onodera ...................... 365/221 |
| 6,560,669 B1* | 5/2003 | Ryan ............................ 711/105 |
| 7,061,941 B1* | 6/2006 | Zheng ........................... 370/535 |
| 7,975,162 B2* | 7/2011 | Kim et al. ..................... 713/500 |

FOREIGN PATENT DOCUMENTS

TW 400521 8/2000

* cited by examiner

*Primary Examiner* — Richard Elms
*Assistant Examiner* — Mohammed A Bashar
(74) *Attorney, Agent, or Firm* — Winston Hsu; Scott Margo

(57) ABSTRACT

A memory access circuit includes a write data circuit and a first write switch circuit. The write data circuit is used for receiving double data rate data or single data rate data, and outputting odd term data and even term data of adjusted double data rate data or adjusted single data rate data. The first write switch circuit is used for outputting the odd term data of the adjusted double data rate data to an odd block of a memory and outputting the even term data of the adjusted double data rate data to an even block of the memory when the write data circuit receives the double data rate data, and outputting the adjusted single data rate data to the even block or the odd block of the memory when the write data circuit receives the single data rate data.

18 Claims, 15 Drawing Sheets

FIG. 3D

| | | | |
|---|---|---|---|
| Turning-on | Turning-on | Turning-on | Turning-on |
| 3162 | 3164 | 3182 | 3184 |

|  | B0=0 | B0=1 |
|---|---|---|
| 3162 | Turning-on | Turning-off |
| 3164 | Turning-off | Turning-on |
| 3182 | Turning-on | Turning-off |
| 3184 | Turning-off | Turning-on |

FIG. 3E

|  | B0=0 | B0=1 |
|---|---|---|
| 3222 | Turning-on | Turning-off |
| 3224 | Turning-off | Turning-on |

FIG. 4D

MEMORY ACCESS CIRCUIT FOR DOUBLE DATA/SINGLE DATA RATE APPLICATIONS

BACKGROUND OF THE INVENTION

1. Field of the Invention

The present invention relates to a memory access circuit, and particularly to a memory access circuit that can be used for double data/single data rate applications.

2. Description of the Prior Art

Please refer to FIG. 1A, FIG. 1B and FIG. 1C. FIG. 1A is a diagram illustrating a memory access circuit 100 for double data rate application according to the prior art, FIG. 1B is a diagram illustrating the memory access circuit 100 writing double data rate data DDRD1, and a corresponding mask block signal MDDRD1, and FIG. 1C is a diagram illustrating the memory access circuit 100 reading double data rate data DDRD2. The memory access circuit 100 includes a write data circuit 102, a mask information circuit 104, a first odd term data input buffer 106, a first even term data input buffer 108, a read data circuit 120, a first odd term data output buffer 122, and a first even term data output buffer 124. As shown in FIG. 1B, after a first input buffer 1022 of the write data circuit 102 receives the double data rate data DDRD1, the first input buffer 1022 extracts odd term data DDRD1_O of the double data rate data DDRD1 to a second odd buffer 1024, and even term data DDRD1_E of the double data rate data DDRD1 to a second even buffer 1026, where a frequency of the odd term data DDRD1_O and a frequency of the even term data DDRD1_E is half of a frequency of the double data rate data DDRD1, and the odd term data DDRD1_O and the even term data DDRD1_E are related and parallel to each other. After a second input buffer 1042 of the mask information circuit 104 receives the mask block signal MDDRD1, the second input buffer 1042 extracts a mask block signal MDDRD1_O corresponding to the odd term data DDRD1_O of the double data rate data DDRD1 to a third odd buffer 1044, and a mask block signal MDDRD1_E corresponding to the even term data DDRD1_E of the double data rate data DDRD1 to a third even buffer 1046.

The first odd term data input buffer 106 receives the odd term data DDRD1_O and the mask block signal MDDRD1_O from the second odd buffer 1024 and the third odd buffer 1044, respectively, and transmits differential signals O1, O1B of odd term data DDRD1_O' to two odd differential buses OB, OBB connected to an odd block of a memory according to the odd term data DDRD1_O and the mask block signal MDDRD1_O. The mask block signal MDDRD1_O is used for blocking partial odd term data of the odd term data DDRD1_O, and then the first odd term data input buffer 106 can generate the differential signals O1, O1B of the odd term data DDRD1_O'. The first even term data input buffer 108 receives the even term data DDRD1_E and the mask block signal MDDRD1_E from the second even buffer 1026 and the third even buffer 1046, respectively, and transmits differential signals E1, E1B of even term data DDRD1_E' to two even differential buses EB, EBB connected to an even block of the memory according to the even term data DDRD1_E and the mask block signal MDDRD1_E. The mask block signal MDDRD1_E is used for blocking partial even term data of the even term data DDRD1_E, and then the first even term data input buffer 108 can generate the differential signals E1, E1B of the even term data DDRD1_E'.

As shown in FIG. 1C, an odd scheduling buffer 1202 of the read data circuit 120 receives odd term data DDRD2_O of double data rate data DDRD2 read and amplified by the first odd term data output buffer 122; an even scheduling buffer 1204 of the read data circuit 120 receives even term data DDRD2_E of the double data rate data DDRD2 read and amplified by the first even term data output buffer 124. An off-chip driver 1206 of the read data circuit 120 is used for increasing accuracy of the odd term data DDRD2_O and the even term data DDRD2_E, and outputting the double data rate data DDRD2.

Please refer to FIG. 2A, FIG. 2B, and FIG. 2C. FIG. 2A is a diagram illustrating a memory access circuit 200 for single data rate application according to the prior art, FIG. 2B is a diagram illustrating the memory access circuit 200 writing single data rate data SDRD1 and a mask block signal MSDRD1, and FIG. 2C is a diagram illustrating the memory access circuit 200 reading single data rate data SDRD2. The memory access circuit 200 includes a write data circuit 202, a mask information circuit 204, a first input register 206, a first output register 208, and a read data circuit 220. As shown in FIG. 2B, after a first input buffer 2022 of the write data circuit 202 receives the single data rate data SDRD1, the first input buffer 2022 stores the single data rate data SDRD1 to a second input register 2024. After a second input buffer 2042 of the mask information circuit 204 receives the mask block signal MSDRD1, the second input buffer 2042 stores the mask block signal MSDRD1 to a third input register 2044.

The first input register 206 receives the single data rate data SDRD1 and the mask block signal MSDRD1 from the second input register 2024 and the third input register 2044, respectively, and transmits differential signals S1, S1B of single data rate data SDRD1' to two differential buses S, SB connected to a memory according to the single data rate data SDRD1 and the mask block signal MSDRD1. The mask block signal MSDRD1 is used for blocking partial data of the single data rate data SDRD1, and then the first input register 206 can generate the differential signals S1, S1B of the single data rate data SDRD1'. Therefore, the differential signals S1, S1B of the single data rate data SDRD1' can be stored in the memory through the two differential buses S, SB.

As shown in FIG. 2C, a scheduling buffer 2202 of the read data circuit 220 receives single data rate data SDRD2' read and amplified by the first output register 208. An off-chip driver 2206 of the read data circuit 220 is used for increasing accuracy of the single data rate data SDRD2', and outputting the single data rate data SDRD2.

To sum up, in the prior art, the memory access circuit 100 and the memory access circuit 200 can not directly share the same memory. Therefore, the prior art may lose competitiveness as technology trends toward light and small memory chips.

SUMMARY OF THE INVENTION

An embodiment provides a memory access circuit for double data/single data rate applications. The memory access circuit includes a write data circuit and a first write switch circuit. The write data circuit is used for receiving a double data rate data or a single data rate data, and outputting odd term data and even term data of adjusted double data rate data, or adjusted single data rate data. The first write switch circuit is used for outputting the odd term data of the adjusted double data rate data to an odd block of a memory, and outputting the even term data of the adjusted double data rate data to an even block of the memory when the write data circuit receives the double data rate data, and outputting the adjusted single data rate data to the odd block of the memory or the even block of the memory when the write data circuit receives the single data rate data.

The present invention provides a memory access circuit for double data/single data rate applications. The memory access circuit can share the same memory when the memory access circuit writes double data rate data and single data rate data in the same memory. Therefore, compared to the prior art, the present invention can solve a problem of a memory access circuit applied to double data rate operation and a memory access circuit applied to single data rate operation not sharing the same memory. Thus, as technology trends toward light and small memory chip trend, the present invention is more competitive than the prior art.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 3D is a diagram illustrating states of the first switch, the second switch, the third switch, and the fourth switch when the memory access circuit receives the double data rate data.

FIG. 3E is a diagram illustrating states of the first switch, the second switch, the third switch, and the fourth switch when the memory access circuit receives the single data rate data.

FIG. 4D is a diagram illustrating states of the fifth switch and the sixth switch when the memory access circuit reads the single data rate data.

DETAILED DESCRIPTION

Figure 1A:
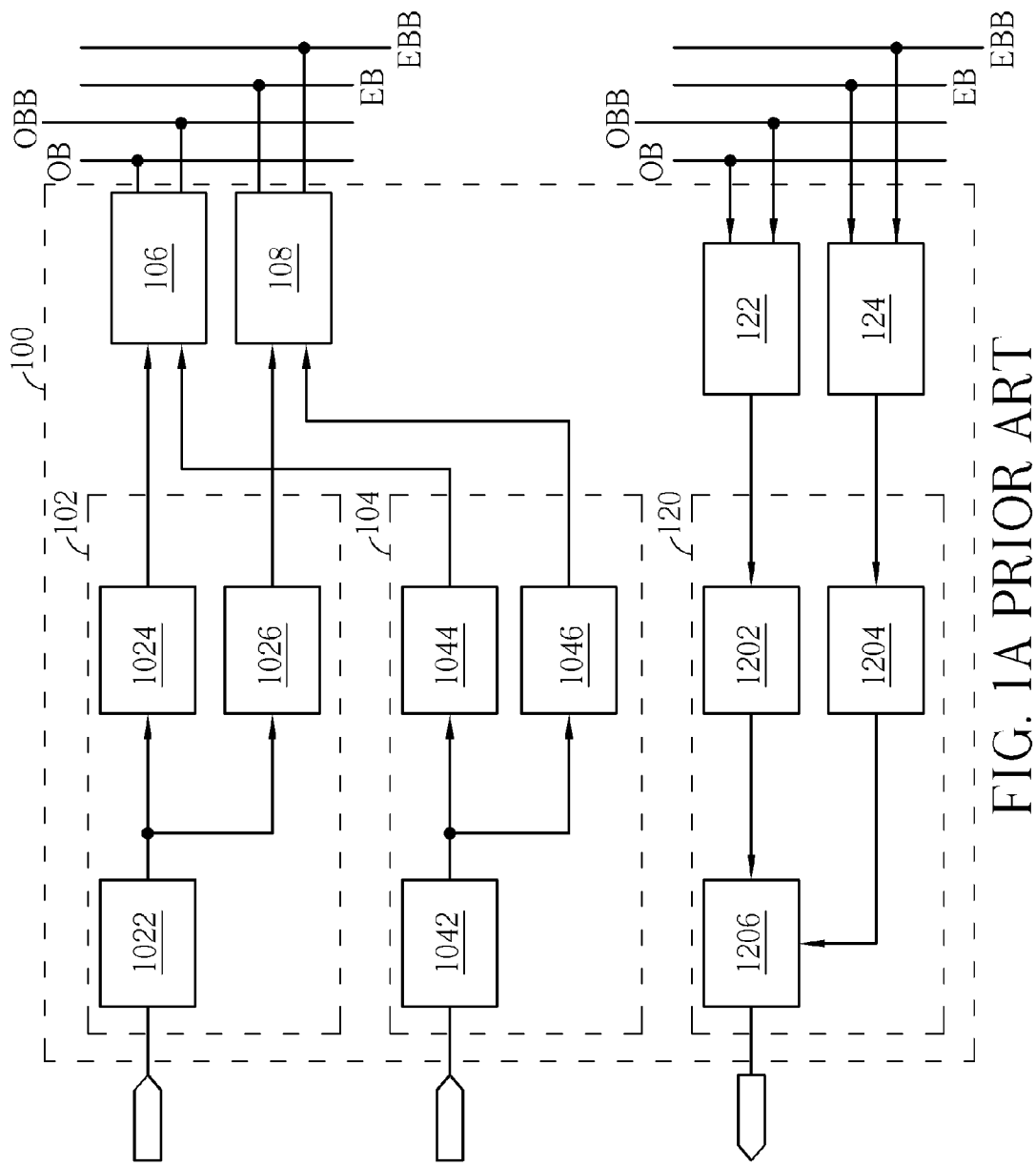
FIG. 1A is a diagram illustrating a memory access circuit for double data rate application according to the prior art.
Figure 1B:
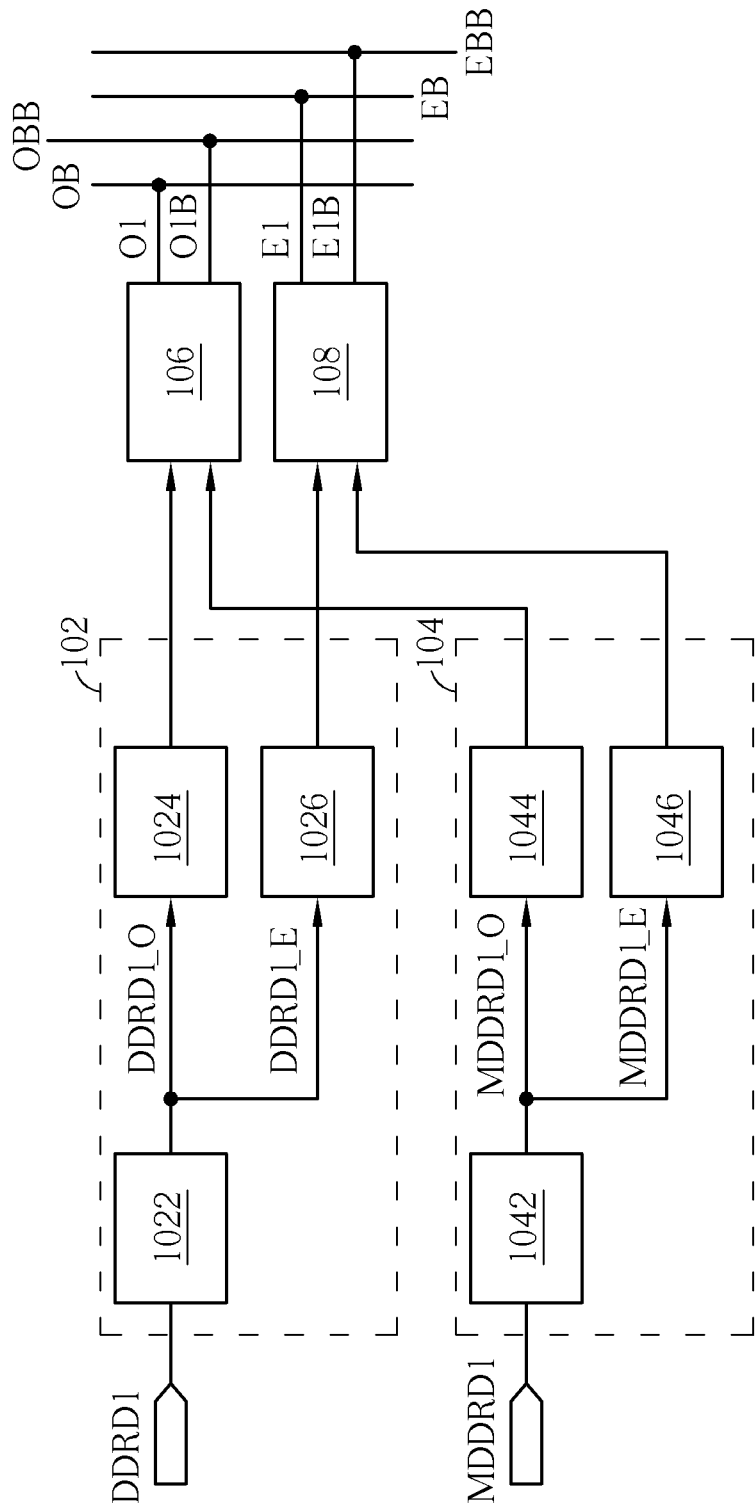
FIG. 1B is a diagram illustrating the memory access circuit writing double data rate data, and a corresponding mask block signal.
Figure 1C:
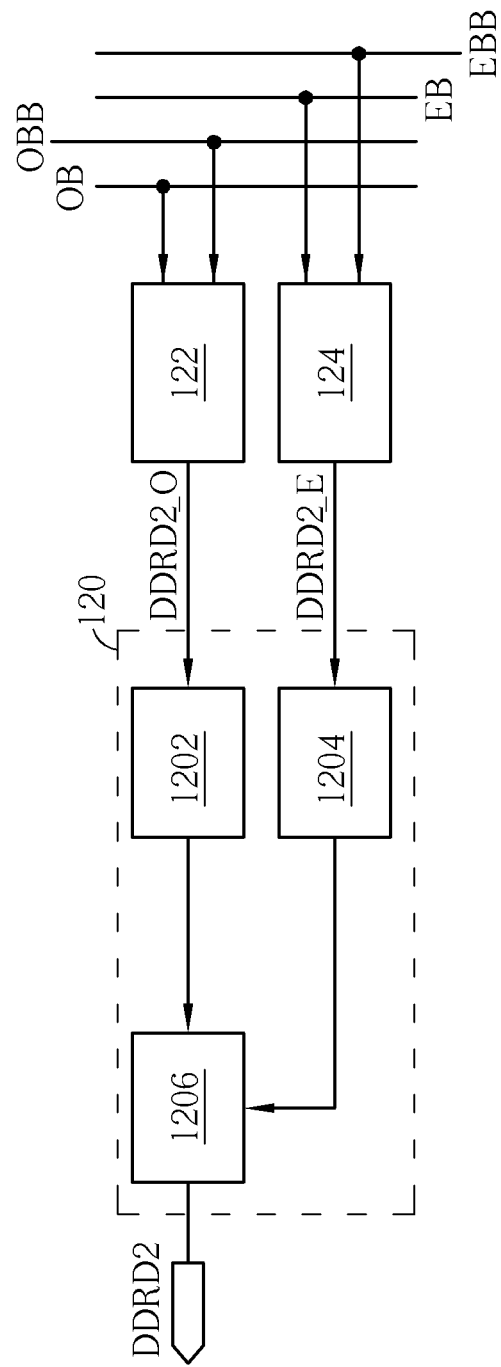
FIG. 1C is a diagram illustrating the memory access circuit reading double data rate data.
Figure 2A:
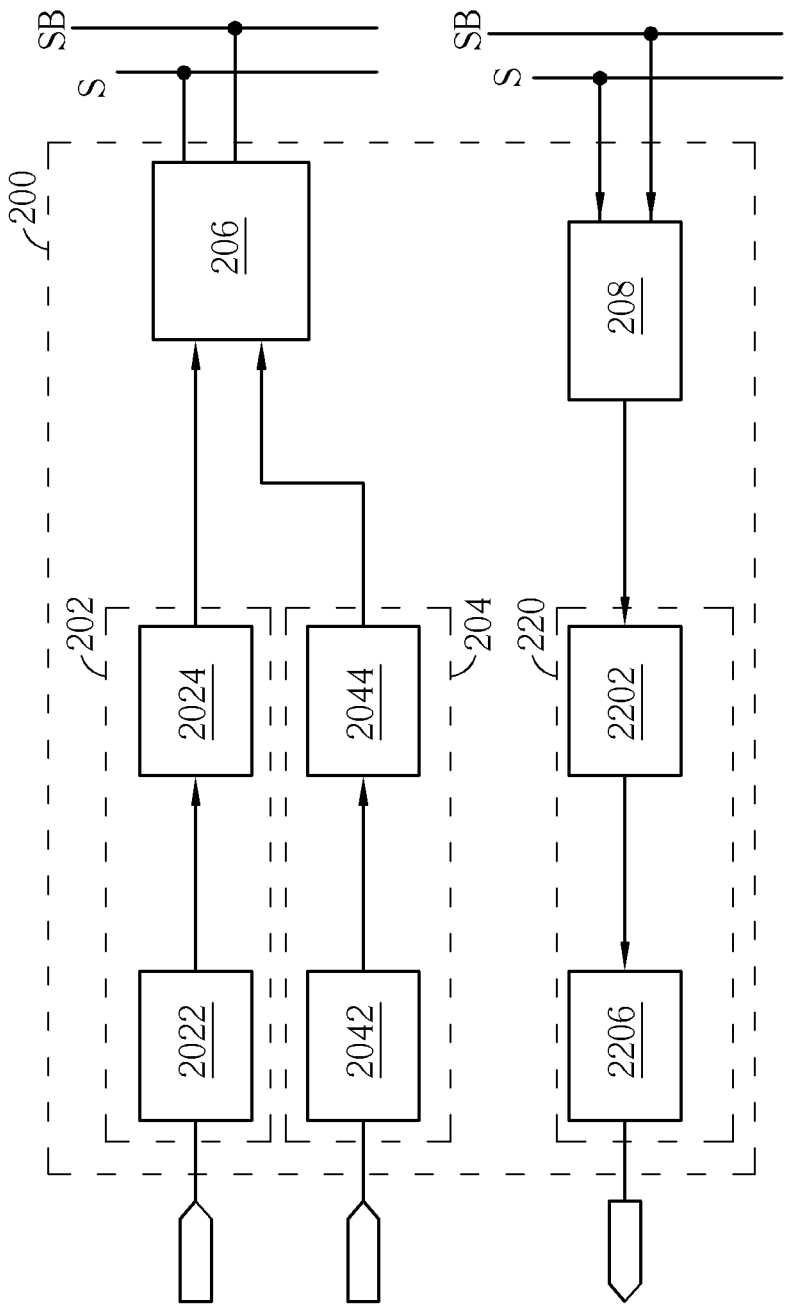
FIG. 2A is a diagram illustrating a memory access circuit for single data rate application according to the prior art.
Figure 2B:
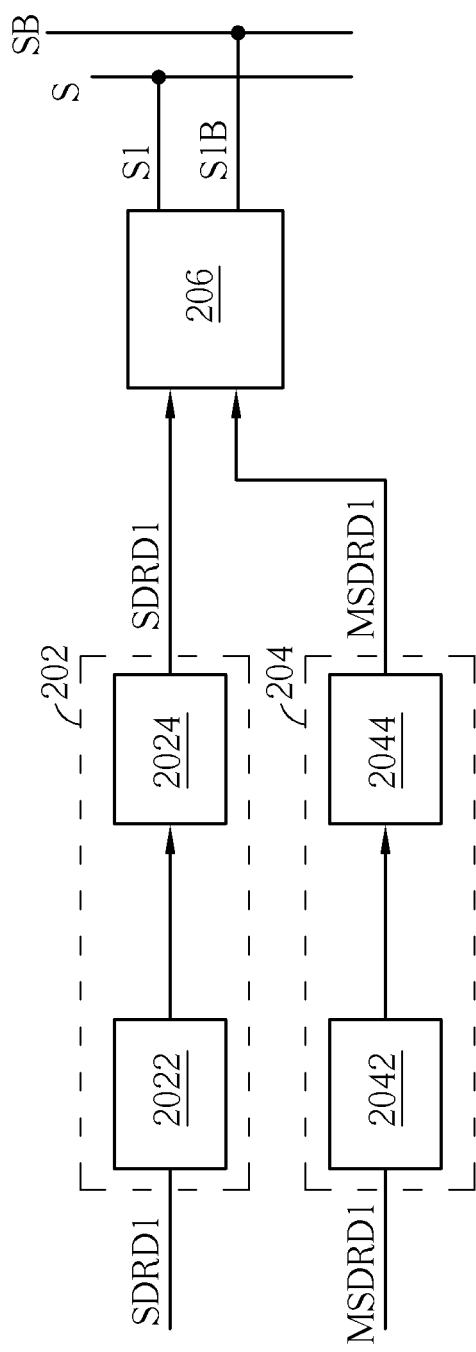
FIG. 2B is a diagram illustrating the memory access circuit writing single data rate data and a mask block signal.
Figure 2C:
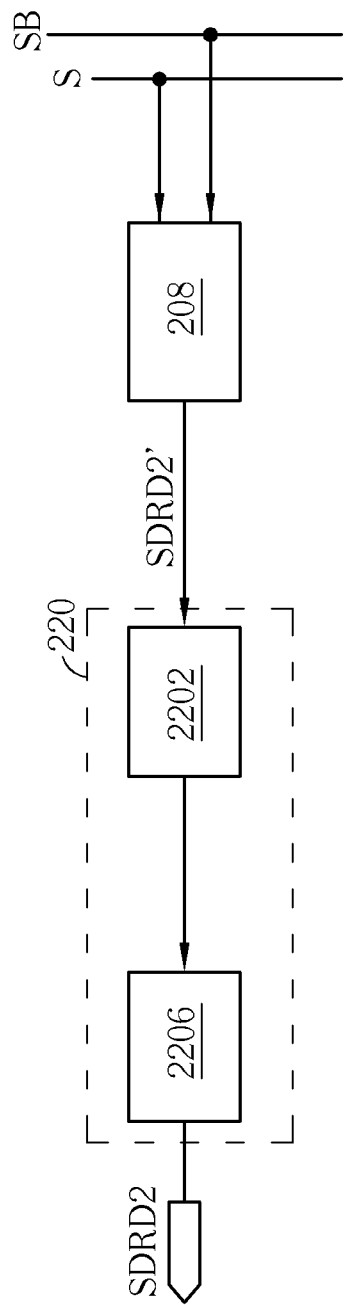
FIG. 2C is a diagram illustrating the memory access circuit reading single data rate data.
Figure 3A:
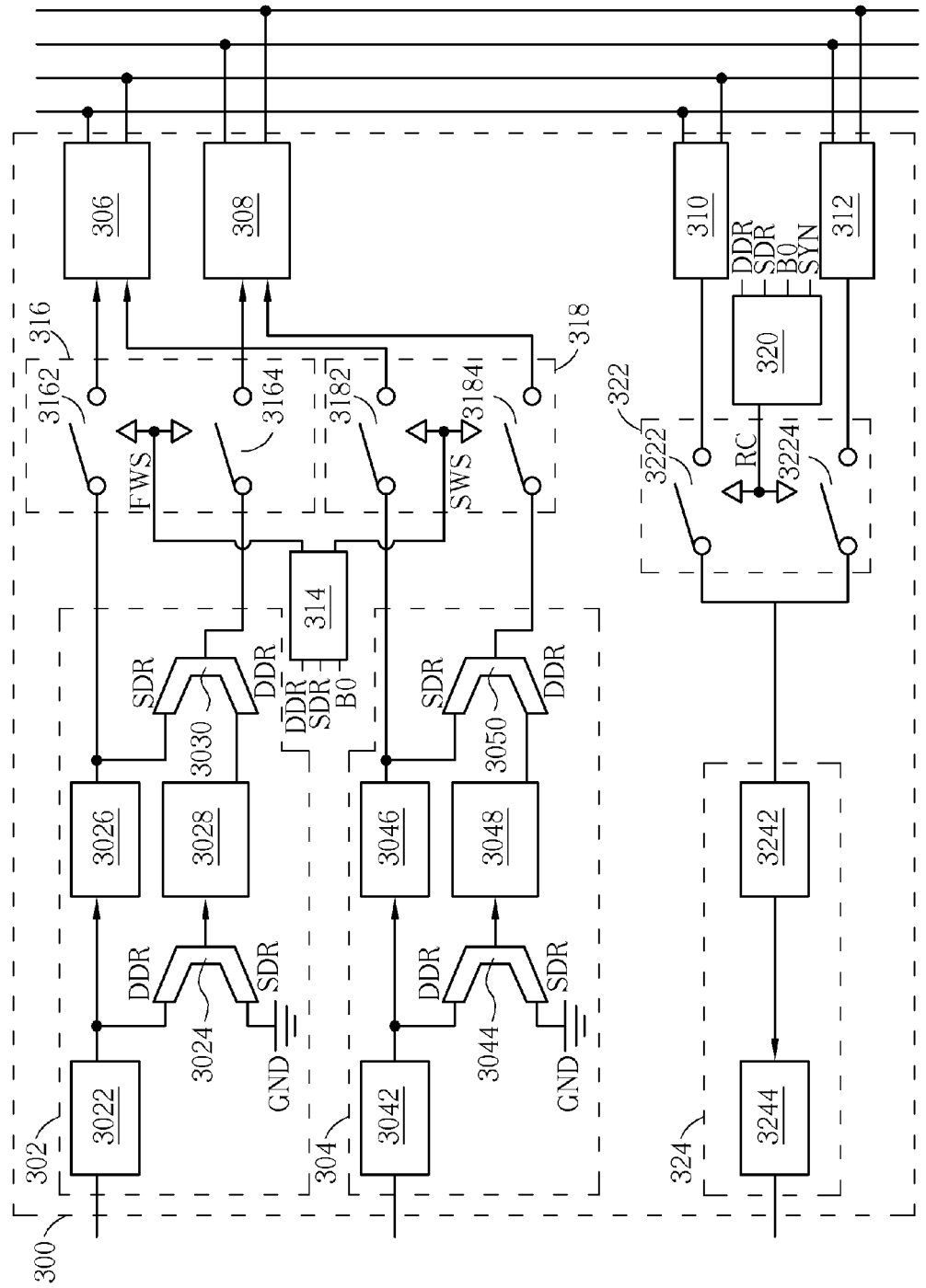
FIG. 3A is a diagram illustrating a memory access circuit for double data/single data rate applications.
Figure 3B:
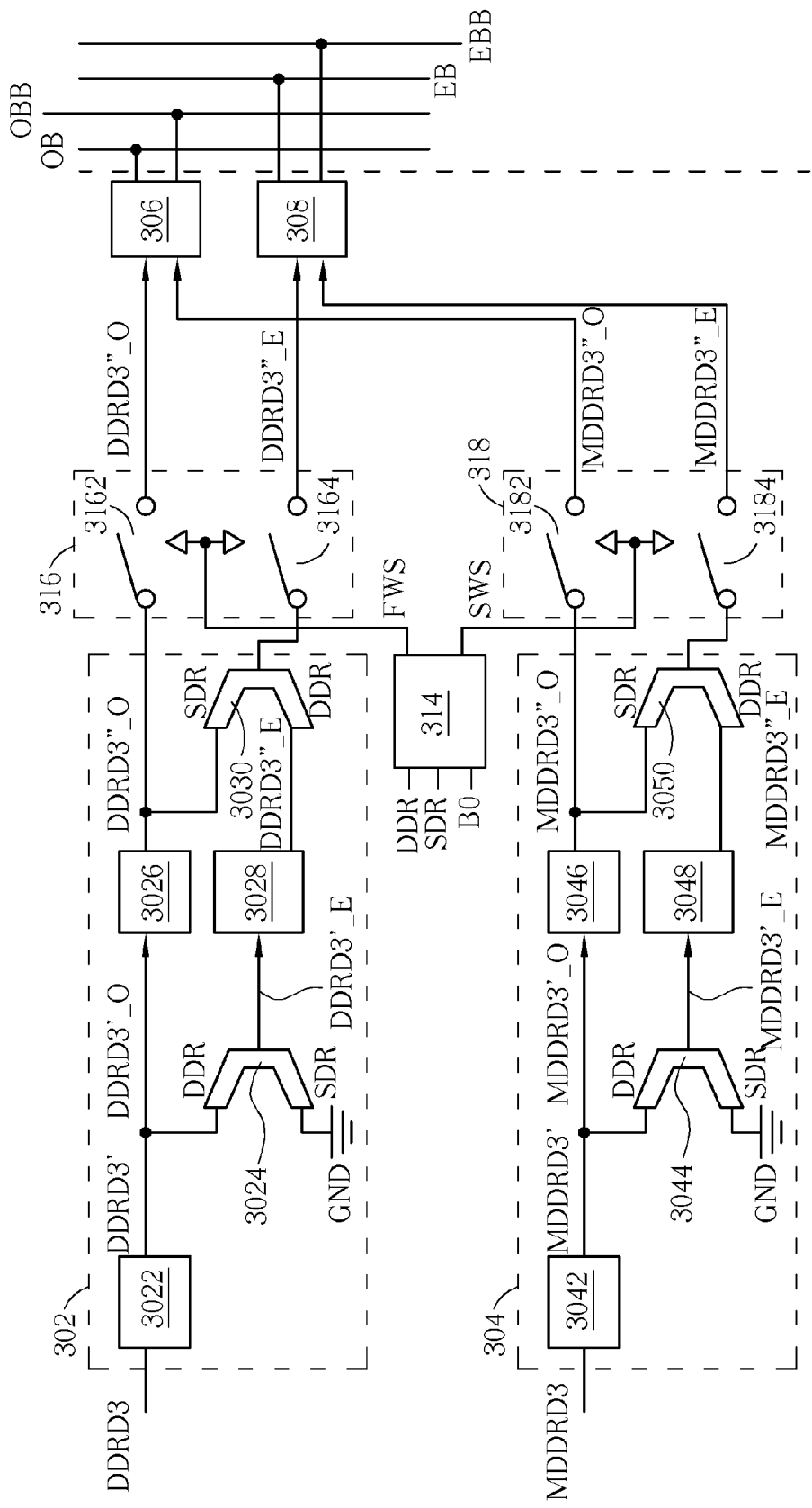
FIG. 3B is a diagram illustrating the memory access circuit writing double data rate data and a mask block signal corresponding to the double data rate data.
Figure 3C:
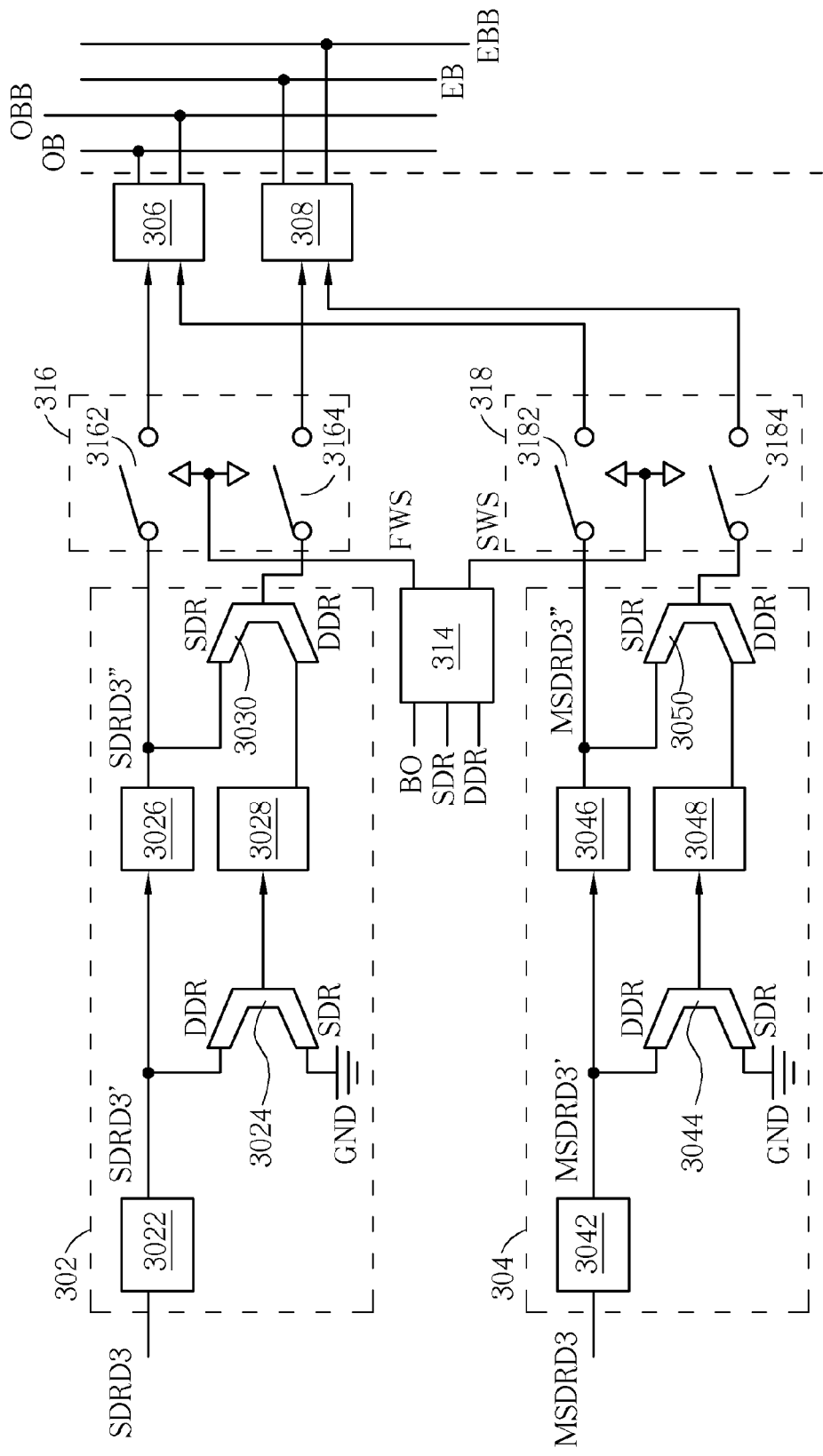
FIG. 3C is a diagram illustrating the memory access circuit writing single data rate data and a mask block signal corresponding to the single data rate data.

Please refer to FIG. 3A, FIG. 3B, and FIG. 3C. FIG. 3A is a diagram illustrating a memory access circuit 300 for double data/single data rate applications, FIG. 3B is a diagram illustrating the memory access circuit 300 writing double data rate data DDRD3 and a mask block signal MDDRD3 corresponding to the double data rate data DDRD3, and FIG. 3C is a diagram illustrating the memory access circuit 300 writing single data rate data SDRD3 and a mask block signal MSDRD3 corresponding to the single data rate data SDRD3. As shown in FIG. 3A, the memory access circuit 300 includes a write data circuit 302, a mask information circuit 304, a first odd term data input buffer 306, a first even term data input buffer 308, a first odd term data output buffer 310, a first even term data output buffer 312, a write switch control circuit 314, a first write switch circuit 316, a second write switch circuit 318, a read switch control circuit 320, a read switch circuit 322, and a read data circuit 324. The write data circuit 302 includes a first input buffer 3022, a first multiplexer 3024, a second odd buffer 3026, a second even buffer 3028, and a second multiplexer 3030. The mask information circuit 304 includes a second input buffer 3042, a third multiplexer 3044, a third odd buffer 3046, a third even buffer 3048, and a fourth multiplexer 3050. The first write switch circuit 316 includes a first switch 3162 and a second switch 3164. The second write switch circuit 318 includes a third switch 3182 and a fourth switch 3184. The read switch circuit 322 includes a fifth switch 3222 and a sixth switch 3224. The read data circuit 324 includes a scheduling buffer 3242 and an off-chip driver 3244. In addition, the write switch control circuit 314 outputs a first write control signal FWS and a second write control signal SWS according to a double data rate signal DDR, a single data rate signal SDR, and a least significant bit B0 of the single data rate signal SDR. The read switch control circuit 320 outputs a read control signal RC according to the double data rate signal DDR, the single data rate signal SDR, a least significant bit B0 of the single data rate signal SDR, and a synchronization signal SYN.

As shown in FIG. 3B, the first input buffer 3022 has a first terminal for receiving the double data rate data DDRD3, and a second terminal for outputting second double data rate data DDRD3'. The first multiplexer 3024 has a first terminal coupled to the second terminal of the first input buffer 3022, a second terminal coupled to ground GND, and an output terminal. The first multiplexer 3024 determines to output potential of the ground GND or even term data DDRD3'_E of the second double data rate data DDRD3' according to the single data rate signal SDR and the double data rate signal DDR. Meanwhile, because the first input buffer 3022 receives the double data rate data DDRD3, the first multiplexer 3024 outputs the even term data DDRD3'_E of the second double data rate data DDRD3'. The second odd buffer 3026 has a first terminal coupled to an output terminal of the first input buffer 3022 for receiving odd term data DDRD3'_O of the second double data rate data DDRD3', and a second terminal for outputting odd term data DDRD3"_O of adjusted double data rate data DDRD3". The second even buffer 3028 has a first terminal coupled to the output terminal of the first multiplexer 3024 for receiving the even term data DDRD3'_E of the second double data rate data DDRD3', and a second terminal for outputting even term data DDRD3"_E of the adjusted double data rate data DDRD3". The second multiplexer 3030 has a first terminal coupled to the output terminal of the second odd buffer 3026, a second terminal coupled to the output terminal of the second even buffer 3028, and an output terminal. The second multiplexer 3030 determines to output the even term data DDRD3"_E of the adjusted double data rate data DDRD3" according to the double data rate signal DDR.

As shown in FIG. 3B, the second input buffer 3042 has a first terminal for receiving the mask block signal MDDRD3 corresponding to the double data rate data DDRD3, and a second terminal for outputting a first mask block signal MDDRD3' corresponding to the double data rate data DDRD3. The third multiplexer 3044 has a first terminal coupled to the second terminal of the second input buffer 3042, a second terminal coupled to the ground GND, and an output terminal. The third multiplexer 3044 determines to output a first mask block signal MDDRD3'_E corresponding to the even term data DDRD3'_E of the second double data rate data DDRD3' according to the double data rate signal DDR. The third odd buffer 3046 has a first terminal coupled to the second terminal of the second input buffer 3042 for receiving a first mask block signal MDDRD3'_O corresponding to the odd term data DDRD3'_O of the second double data rate data DDRD3', and a second terminal for outputting a mask block signal MDDRD3"_O corresponding to the odd term data DDRD3"_O of the adjusted double data rate data DDRD3". The third even buffer 3048 has a first terminal coupled to the output terminal of the third multiplexer 3044 for receiving the first mask block signal MDDRD3'_E corresponding to the even term data DDRD3'_E of the second double data rate data DDRD3', and a second terminal for outputting a mask block signal MDDRD3"_E corresponding to the even term data DDRD3"_E of the adjusted double data rate data DDRD3". The fourth multiplexer 3050 has a first terminal coupled to the output terminal of the third odd buffer 3046, a second terminal coupled to the output terminal of the third even buffer 3048, and an output terminal. The fourth multiplexer 3050 determines to output the mask block signal MDDRD3"_E corresponding to the even term data DDRD3"_E of the adjusted double data rate data DDRD3" according to the double data rate signal DDR.

Please refer to FIG. 3D. FIG. 3D is a diagram illustrating states of the first switch 3162, the second switch 3164, the third switch 3182, and the fourth switch 3184 when the memory access circuit 300 receives the double data rate data DDRD3. As shown in FIG. 3D, when the memory access circuit 300 receives the double data rate data DDRD3, the first switch 3162, the second switch 3164, the third switch 3182, and the fourth switch 3184 are all turned on. As shown in FIG. 3B, the first switch 3162 has a first terminal coupled to the output terminal of the second odd buffer 3026, a second terminal for receiving the first write control signal FWS, and a third terminal for outputting the odd term data DDRD3"_O of the adjusted double data rate data DDRD3" to the first odd term data input buffer 306 according to the first write control signal FWS. The second switch 3164 has a first terminal coupled to the output terminal of the second multiplexer 3030, a second terminal for receiving the first write control signal FWS, and a third terminal for outputting the even term data DDRD3"_E of the adjusted double data rate data DDRD3" to the first even term data input buffer 308 according to the first write control signal FWS.

As shown in FIG. 3B and FIG. 3D, the third switch 3182 has a first terminal coupled to the output terminal of the third odd buffer 3046, a second terminal for receiving the second write control signal SWS, and a third terminal for outputting the mask block signal MDDRD3"_O corresponding to the odd term data DDRD3"_O of the adjusted double data rate data DDRD3" to the first odd term data input buffer 306 according to the second write control signal SWS. The fourth switch 3184 has a first terminal coupled to the output terminal of the fourth multiplexer 3050, a second terminal for receiving the second write control signal SWS, and a third terminal for outputting the mask block signal MDDRD3"_E corresponding to the even term data DDRD3"_E of the adjusted double data rate data DDRD3" to the first even term data input buffer 308 according to the second write control signal SWS.

Therefore, the first odd term data input buffer 306 can utilize the mask block signal MDDRD3"_O to block partial odd term data of the odd term data DDRD3"_O of the adjusted double data rate data DDRD3", and write non-blocked odd term data of the odd term data DDRD3'_O in an odd block of the memory through two odd differential buses OB, OBB connected to the odd block of the memory. The first even term data input buffer 308 can utilize the mask block signal MDDRD3"_E to block partial even term data of the even term data DDRD3"_E of the adjusted double data rate data DDRD3", and write non-blocked even term data of the even term data DDRD3"_E in an even block of the memory through two even differential buses EB, EBB connected to the even block of the memory.

As shown in FIG. 3C, the first input buffer 3022 receives the single data rate data SDRD3, and outputs a second single data rate data SDRD3'. The first multiplexer 3024 determines to output the potential of the ground GND according to the single data rate signal SDR. The second odd buffer 3026 receives the second single data rate data SDRD3', and outputs adjusted single data rate data SDRD3". Meanwhile, because the second even buffer 3028 receives the potential of the ground GND, the second even buffer 3028 is turned off.

As shown in FIG. 3C, the second input buffer 3042 receives the mask block signal MSDRD3 corresponding to the single data rate data SDRD3, and outputs a first mask block signal MSDRD3' corresponding to the single data rate data SDRD3. The third multiplexer 3044 determines to output the potential of the ground GND according to the single data rate signal SDR. The third odd buffer 3046 receives the first mask block signal MSDRD3' corresponding to the second single data rate data SDRD3', and outputs a mask block signal MSDRD3" corresponding to the adjusted single data rate data SDRD3". Meanwhile, because the third even buffer 3048 receives the potential of the ground GND, the third even buffer 3048 is turned off.

Please refer to FIG. 3E. FIG. 3E is a diagram illustrating states of the first switch 3162, the second switch 3164, the third switch 3182, and the fourth switch 3184 when the memory access circuit 300 receives the single data rate data SDRD3. As shown in FIG. 3E, when the memory access circuit 300 receives the single data rate data SDRD3, the first switch 3162, the second switch 3164, the third switch 3182, the fourth switch 3184 are turned on and turned off according to a least significant bit B0 of the single data rate signal SDR. Therefore, as shown in FIG. 3C, when the first switch 3162 is turned on and the second switch 3164 turned off, the adjusted single data rate data SDRD3" is inputted to the first odd term data input buffer 306 through the first switch 3162; and when the first switch 3162 is turned off and the second switch 3164 is turned on, the adjusted single data rate data SDRD3" is inputted to the first even term data input buffer 308 through the second switch 3164. In addition, as shown in FIG. 3C, when the third switch 3182 is turned on and the fourth switch 3184 is turned off, the mask block signal MSDRD3" is inputted to the first odd term data input buffer 306 through the third switch 3182; and when the fourth switch 3184 is turned on and the third switch 3182 is turned off, the mask block signal MSDRD3" is inputted to the first even term data input buffer 308 through the fourth switch 3184. It is noted that the present invention is not limited to the states of turning-on and turning-off of the first switch 3162 to the fourth switch 3184 in FIG. 3E. In another embodiment of the present invention, opposite logic rules can also be applied for states of turning-on and turning-off of the first switch 3162 to the fourth switch 3184.

Therefore, the first odd term data input buffer 306 can utilize the mask block signal MSDRD3" to block partial data of the adjusted single data rate data SDRD3", and write non-blocked data of the adjusted single data rate data SDRD3" in the odd block of the memory through the two odd differential buses OB, OBB connected to the odd block of the memory. The first even term data input buffer 308 can utilize the mask block signal MSDRD3" to block partial data of the adjusted single data rate data SDRD3", and write non-blocked data of the adjusted single data rate data SDRD3" in the even block of the memory through the two even differential buses EB, EBB connected to the even block of the memory.

Figure 4A:
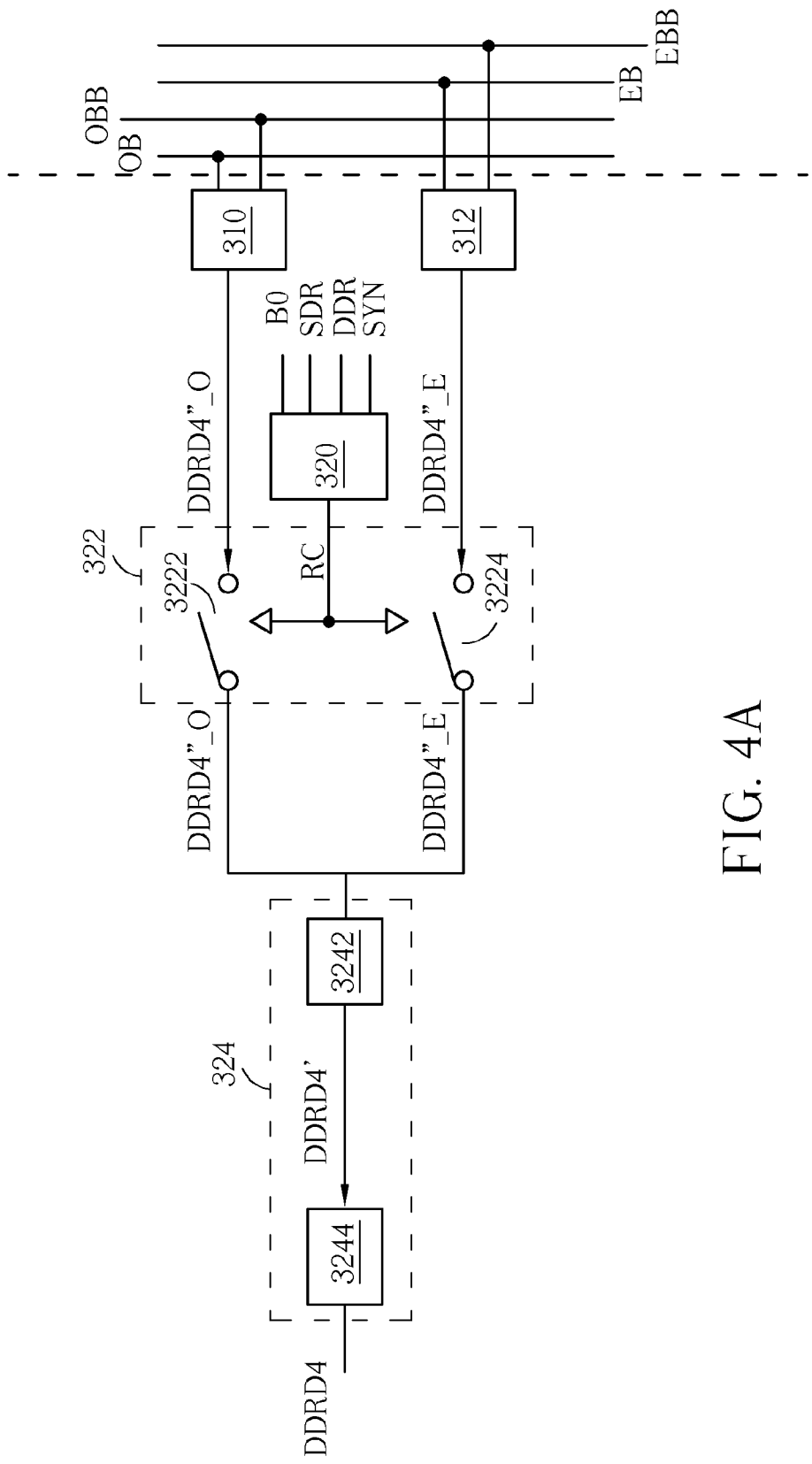
FIG. 4A is a diagram illustrating the memory access circuit reading first double data rate data.
Figure 4B:
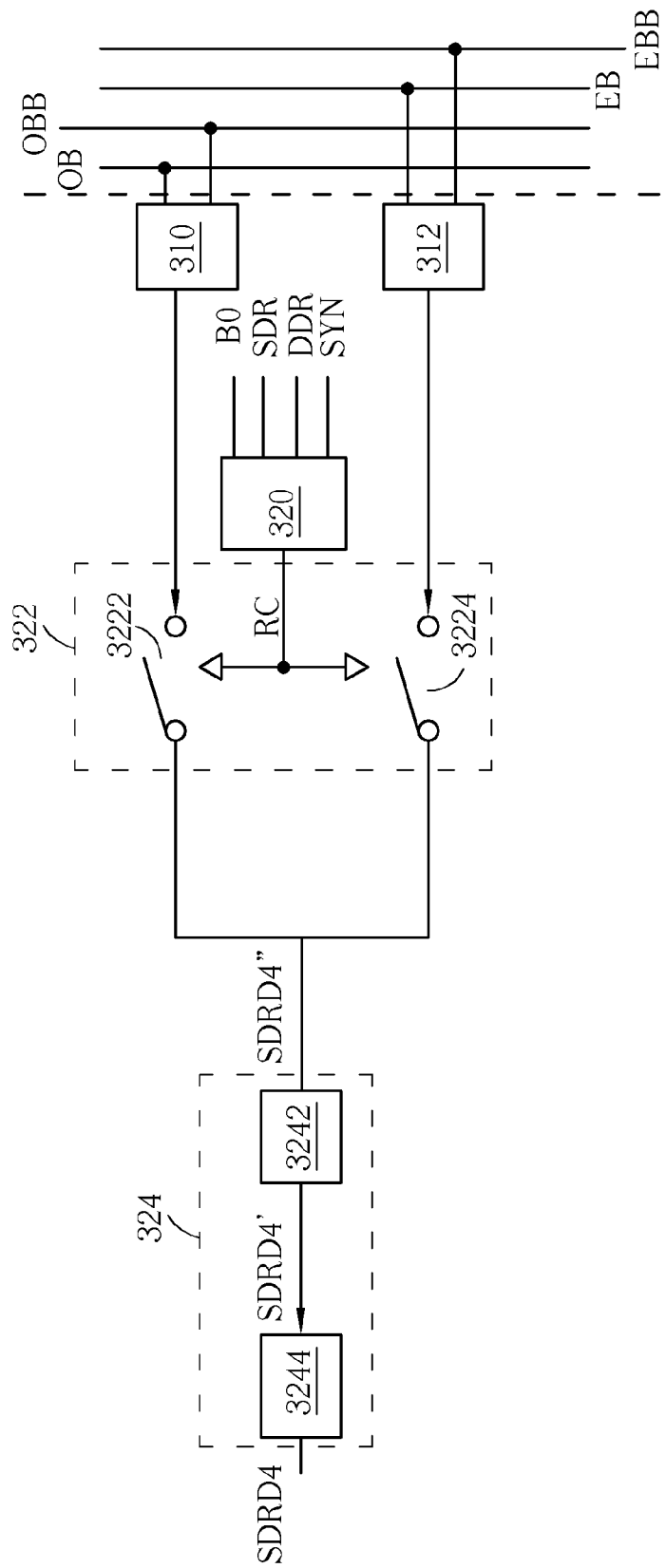
FIG. 4B is a diagram illustrating the memory access circuit reading single data rate data.
Figure 4C:
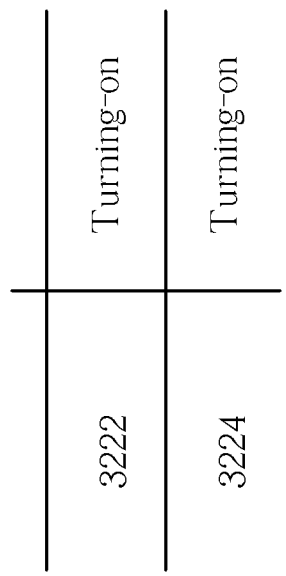
FIG. 4C is a diagram illustrating states of the fifth switch and the sixth switch when the memory access circuit reads the first double data rate data.

Please refer to FIG. 4A, FIG. 4B, FIG. 4C, and FIG. 4D. FIG. 4A is a diagram illustrating the memory access circuit 300 reading first double data rate data DDRD4, FIG. 4B is a diagram illustrating the memory access circuit 300 reading single data rate data SDRD4, FIG. 4C is a diagram illustrating states of the fifth switch 3222 and the sixth switch 3224 when the memory access circuit 300 reads the first double data rate data DDRD4, and FIG. 4D is a diagram illustrating states of the fifth switch 3222 and the sixth switch 3224 when the memory access circuit 300 reads the single data rate data SDRD4. As shown in FIG. 4A and FIG. 4C, because the fifth switch 3222 and the sixth switch 3224 are all turned on, the fifth switch 3222 outputs odd term data DDRD4"_O of double data rate data DDRD4" outputted by the first odd term data output buffer 310, and the sixth switch 3224 outputs even term data DDRD4'_E of the double data rate data DDRD4" outputted by the first even term data output buffer 312, where the first odd term data output buffer 310 receives the odd term data DDRD4"_O of the double data rate data DDRD4" through the two odd differential buses OB, OBB, and the first even term data output buffer 312 receives the even term data DDRD4"_E of the double data rate data DDRD4" through the two even differential buses EB, EBB. The scheduling buffer 3242 is coupled to the read switch circuit 322 for scheduling and adjusting the odd term data DDRD4'_O of the double data rate data DDRD4" and the even term data DDRD4'_E of the double data rate data DDRD4" to double data rate register data DDRD4'. The off-chip driver 3244 is used for increasing accuracy of the double data rate register data DDRD4' to generate and output the first double data rate data DDRD4.

As shown in FIG. 4D, when the memory access circuit 300 reads the single data rate data SDRD4, the fifth switch 3222 and the sixth switch 3224 are turned on and turned off according to a least significant bit B0 of the single data rate signal SDR. Therefore, as shown in FIG. 4B, when the fifth switch 3222 is turned on and the sixth switch 3224 is turned off, single data rate data SDRD4" is inputted to the first odd term data output buffer 310 from the odd block of the memory through the two odd differential buses OB, OBB. Then, the single data rate data SDRD4" is inputted to the scheduling buffer 3242 through the fifth switch 3222. When the fifth switch 3222 is turned off and the sixth switch 3224 is turned on, single data rate data SDRD4" is inputted to the first even term data output buffer 312 from the even block of the memory through the two even differential buses EB, EBB. Then, the single data rate data SDRD4" is inputted to the scheduling buffer 3242 through the sixth switch 3224. It is noted that the present invention is not limited to the states of turning-on and turning-off of the fifth switch 3222 and the sixth switch 3224 in FIG. 4D. In another embodiment of the present invention, opposite logic rules can also be applied for states of turning-on and turning-off of the fifth switch 3222 and the sixth switch 3224.

The scheduling buffer 3242 adjusts the single data rate data SDRD4" outputted by the first odd term data output buffer 310 and the single data rate data SDRD4" outputted by the first even term data output buffer 312 to single data rate register data SDRD4'. The off-chip driver 3244 is used for increasing accuracy of the single data rate register data SDRD4' to output the first single data rate data SDRD4.

To sum up, the memory access circuit for double data/single data rate application can share the same memory when the memory access circuit writes double data rate data and single data rate data in the same memory. Therefore, compared to the prior art, the present invention can solve a problem of a memory access circuit applied to double data rate operation and a memory access circuit applied to single data rate operation not sharing the same memory. Thus, as technology trends toward light and small memory chips, the present invention is more competitive than the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory access circuit for double data/single data rate applications, the memory access circuit comprising:
    a write data circuit for receiving double data rate data or single data rate data, and outputting odd term data and even term data of adjusted double data rate data, or adjusted single data rate data; and
    a first write switch circuit for outputting the odd term data of the adjusted double data rate data to an odd block of a memory, and outputting the even term data of the adjusted double data rate data to an even block of the memory when the write data circuit receives the double data rate data, wherein the first write switch circuit is further used for outputting the adjusted single data rate data to the odd block of the memory or the even block of the memory according to a logic value of a least significant bit of the single data rate data when the write data circuit receives the single data rate data, wherein the first write switch circuit writes/reads the whole adjusted single data rate data to/from the odd block of the memory or the even block of the memory, rather than writing/reading the adjusted single data rate data to/from the odd block of the memory or the even block of the memory by a one bit by one bit method.

2. The memory access circuit of claim 1, further comprising:
    a first odd term data input buffer coupled to the first write switch circuit and coupled to two odd differential buses of the odd block of the memory for temporarily storing the odd term data of the adjusted double data rate data and the adjusted single data rate data outputted by the first write switch circuit; and
    a first even term data input buffer coupled to the first write switch circuit and coupled to two even differential buses of the even block of the memory for temporarily storing the even term data of the adjusted double data rate data and the adjusted single data rate data outputted by the first write switch circuit.

3. The memory access circuit of claim 2, further comprising:
    a mask information circuit for receiving a mask block signal corresponding to the double data rate data or a mask block signal corresponding to the single data rate data, and outputting mask block signals corresponding to the odd term data and the even term data of the adjusted double data rate data, or a mask block signal corresponding to the adjusted single data rate data; and
    a second write switch circuit for outputting the mask block signal corresponding to the odd term data of the adjusted double data rate data to the first odd term data input buffer, and outputting the mask block signal corresponding to the even term data of the adjusted double data rate data to the first even term data input buffer when the write data circuit receives the double data rate data, and outputting the mask block signal corresponding to the adjusted single data rate data to the first odd term data input buffer or the first even term data input buffer according to the logic value of the least significant bit of the single data rate data when the write data circuit receives the single data rate data.

4. The memory access circuit of claim 3, wherein:
the mask block signal corresponding to the odd term data of the adjusted double data rate data is used for blocking partial data of the odd term data of the adjusted double data rate data to be outputted to the odd block of the memory;
the mask block signal corresponding to the even term data of the adjusted double data rate data is used for blocking partial data of the even term data of the adjusted double data rate data to be outputted to the even block of the memory; and
the mask block signal corresponding to the adjusted single data rate data is used for blocking partial data of the adjusted single data rate data to be outputted to the odd block of the memory or the even block of the memory.

5. The memory access circuit of claim 3, further comprising:
a write switch control circuit for controlling the first write switch circuit and the second write switch circuit according to a double data rate signal, a single data rate signal, and the logic value of the least significant bit of the single data rate data received by the write data circuit.

6. The memory access circuit of claim 5, wherein:
the first write switch circuit outputs the adjusted single data rate data to the first odd term data input buffer, and the second write switch circuit outputs the mask block signal corresponding to the adjusted single data rate data to the first odd term data input buffer when the logic value of the least significant bit of the single data rate data received by the write data circuit is logic "0"; and
the first write switch circuit outputs the adjusted single data rate data to the first even term data input buffer, and the second write switch circuit outputs the mask block signal corresponding to the adjusted single data rate data to the first even term data input buffer when the logic value of the least significant bit of the single data rate data received by the write data circuit is logic "1".

7. The memory access circuit of claim 5, wherein:
the first write switch circuit outputs the adjusted single data rate data to the first odd term data input buffer, and the second write switch circuit outputs the mask block signal corresponding to the adjusted single data rate data to the first odd term data input buffer when the logic value of the least significant bit of the single data rate data received by the write data circuit is logic "1"; and
the first write switch circuit outputs the adjusted single data rate data to the first even term data input buffer, and the second write switch circuit outputs the mask block signal corresponding to the adjusted single data rate data to the first even term data input buffer when the logic value of the least significant bit of the single data rate data received by the write data circuit is logic "0".

8. The memory access circuit of claim 1, further comprising:
a read switch circuit outputting odd term data of double data rate data from the odd block of the memory and even term data of the double data rate data from the even block of the memory, or outputting single data rate data from the odd block of the memory or single data rate data from the even block of the memory according to a read control signal; and
a read data circuit for scheduling and adjusting the odd term data of the double data rate data and the even term data of the double data rate data outputted by the read switch circuit to a first double data rate data and outputting the first double data rate data, and adjusting the single data rate data outputted by the read switch circuit to a first single data rate data and outputting the first single data rate data.

9. The memory access circuit of claim 8, further comprising:
a first odd term data output buffer coupled to the read switch circuit and coupled to two odd differential buses of the odd block of the memory; and
a first even term data output buffer coupled to the read switch circuit and coupled to two even differential buses of the even block of the memory.

10. The memory access circuit of claim 8, further comprising:
a read switch control circuit for outputting the read control signal according to a double data rate signal, a single data rate signal, a logic value of a least significant bit of the single data rate data from the odd block of the memory/a logic value of a least significant bit of the single data rate data from the even block of the memory, and a synchronization signal.

11. The memory access circuit of claim 10, wherein:
the read switch circuit outputting the single data rate data from the odd block of the memory when the logic value of the least significant bit of the single data rate data from the odd block of the memory or the logic value of the least significant bit of the single data rate data from the even block of the memory is logic "0"; and
the read switch circuit outputting the single data rate data from the even block of the memory when the logic value of the least significant bit of the single data rate data from the odd block of the memory or the logic value of the least significant bit of the single data rate data from the even block of the memory is logic "1".

12. The memory access circuit of claim 10, wherein:
the read switch circuit outputting the single data rate data from the odd block of the memory when the logic value of the least significant bit of the single data rate data from the odd block of the memory or the logic value of the least significant bit of the single data rate data from the even block of the memory is logic "1"; and
the read switch circuit outputting the single data rate data from the even block of the memory when the logic value of the least significant bit of the single data rate data from the odd block of the memory or the logic value of the least significant bit of the single data rate data from the even block of the memory is logic "0".

13. The memory access circuit of claim 1, wherein the write data circuit comprises:
a first input buffer having a first terminal for receiving the double data rate data and the single data rate data, and a second terminal for outputting a second double data rate data and a second single data rate data;
a first multiplexer having a first terminal coupled to the second terminal of the first input buffer, a second terminal coupled to ground, and an output terminal, wherein the first multiplexer determines to output even term data of the second double data rate data or potential of the ground according to a double data rate signal and a single data rate signal;

a second odd buffer having a first terminal coupled to an output terminal of the first input buffer for receiving odd term data of the second double data rate data and the second single data rate data, and a second terminal for outputting the odd term data of the adjusted double data rate data and the adjusted single data rate data;

a second even buffer having a first terminal coupled to the output terminal of the first multiplexer for receiving the even term data of the second double data rate data, and a second terminal for outputting the even term data of the adjusted double data rate data; and a second multiplexer having a first terminal coupled to the output terminal of the second odd buffer, a second terminal coupled to the output terminal of the second even buffer, and an output terminal, wherein the second multiplexer determines to output the even term data of the adjusted double data rate data or the adjusted single data rate data according to the double data rate signal and the single data rate signal.

14. The memory access circuit of claim 3, wherein the mask information circuit comprises:

a second input buffer having a first terminal for receiving the mask block signal corresponding to the double data rate data and the mask block signal corresponding to the single data rate data, and a second terminal for outputting a first mask block signal corresponding to the double data rate data and a first mask block signal corresponding to the single data rate data;

a third multiplexer having a first terminal coupled to the second terminal of the second input buffer, a second terminal coupled to ground, and an output terminal, wherein the third multiplexer determines to output potential of the ground or a first mask block signal corresponding to even term data of a second double data rate data according to a single data rate signal and a double data rate signal;

a third odd buffer having a first terminal coupled to the second terminal of the second input buffer for receiving a first mask block signal corresponding to odd term data of the second double data rate data and the first mask block signal corresponding to the single data rate data, and a second terminal for outputting the mask block signal corresponding to the odd term data of the adjusted double data rate data and the mask block signal corresponding to the adjusted single data rate data;

a third even buffer having a first terminal coupled to the output terminal of the third multiplexer for receiving the first mask block signal corresponding to the even term data of the second double data rate data, and a second terminal for outputting the mask block signal corresponding to the even term data of the adjusted double data rate data; and a fourth multiplexer having a first terminal coupled to the output terminal of the third odd buffer, a second terminal coupled to the second terminal of the third even buffer, and an output terminal, wherein the fourth multiplexer determines to output the mask block signal corresponding to the adjusted single data rate data or the mask block signal corresponding to the even term data of the adjusted double data rate data according to the single data rate signal and the double data rate signal.

15. The memory access circuit of claim 1, wherein the first write switch circuit comprises:

a first switch having a first terminal coupled to the output terminal of the second odd buffer, a second terminal for receiving a first write control signal, and a third terminal for outputting the odd term data of the adjusted double data rate data and the adjusted single data rate data according to the first write control signal; and a second switch having a first terminal coupled to the output terminal of the second multiplexer, a second terminal for receiving the first write control signal, and a third terminal for outputting the even term data of the adjusted double data rate data and the adjusted single data rate data according to the first write control signal.

16. The memory access circuit of claim 14, wherein the second write switch circuit comprises:

a third switch having a first terminal coupled to the second terminal of the third odd buffer, a second terminal for receiving a second write control signal, and a third terminal for outputting the mask block signal corresponding to the odd term data of the adjusted double data rate data and the mask block signal corresponding to the adjusted single data rate data according to the second write control signal; and a fourth switch having a first terminal coupled to the output terminal of the fourth multiplexer, a second terminal for receiving the second write control signal, and a third terminal for outputting the mask block signal corresponding to the adjusted single data rate data and the mask block signal corresponding to the even term data of the adjusted double data rate data according to the second write control signal.

17. The memory access circuit of claim 9, wherein the read switch circuit comprises:

a fifth switch having a first terminal coupled to the first odd term data output buffer, a second terminal for receiving the read control signal, and a third terminal for outputting the odd term data of the double data rate data outputted by the first odd term data output buffer and the single data rate data outputted by the first odd term data output buffer according to the read control signal; and a sixth switch having a first terminal coupled to the first even term data output buffer, a second terminal for receiving the read control signal, and a third terminal for outputting the even term data of the double data rate data outputted by the first even term data output buffer and the single data rate data outputted by the first even term data output buffer according to the read control signal.

18. The memory access circuit of claim 9, wherein the read data circuit comprises:

a scheduling buffer coupled to the read switch circuit for scheduling and adjusting the odd term data of the double data rate data outputted by the first odd term data output buffer and the even term data of the double data rate data outputted by the first even term data output buffer to double data rate register data, and adjusting the single data rate data outputted by the first odd term data output buffer and the single data rate data outputted by the first even term data output buffer to single data rate register data; and an off-chip driver for increasing accuracy of the double data rate register data to generate and output the first double data rate data, and increasing accuracy of the single data rate register data to generate and output the first single data rate data.

* * * * *